United States Patent
Jefremow et al.

(10) Patent No.: US 8,559,243 B2
(45) Date of Patent: Oct. 15, 2013

(54) SELF TIMED CURRENT INTEGRATING SCHEME EMPLOYING LEVEL AND SLOPE DETECTION

(75) Inventors: Mihail Jefremow, Augsburg (DE); Thomas Kern, Munich (DE); Ullrich Menczigar, Vaterstetten (DE); Ulrich Backhausen, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 401 days.

(21) Appl. No.: 12/951,190

(22) Filed: Nov. 22, 2010

(65) Prior Publication Data
US 2012/0126783 A1    May 24, 2012

(51) Int. Cl.
*G11C 7/06* (2006.01)

(52) U.S. Cl.
USPC ............. 365/189.07; 365/148; 365/189.011; 365/189.15; 365/189.09; 365/210.1

(58) Field of Classification Search
USPC ............... 365/148, 189.011, 189.15, 189.07, 365/189.09, 210.1
See application file for complete search history.

(56) References Cited

U.S. PATENT DOCUMENTS

| 5,754,466 | A | 5/1998 | Arase |
| 7,372,259 | B1 * | 5/2008 | Crist ........................... 324/244 |
| 7,859,906 | B1 * | 12/2010 | Vispute ..................... 365/185.21 |
| 8,023,311 | B2 * | 9/2011 | Kim et al. ..................... 365/148 |
| 2007/0171698 | A1 * | 7/2007 | Hoenigschmid et al. ..... 365/148 |
| 2009/0027984 | A1 | 1/2009 | Mizuno et al. |
| 2009/0103368 | A1 | 4/2009 | Ogawa et al. |
| 2009/0285032 | A1 * | 11/2009 | Choi ........................ 365/189.05 |
| 2010/0214860 | A1 * | 8/2010 | Upputuri ..................... 365/206 |
| 2010/0296349 | A1 * | 11/2010 | Yoon ........................ 365/189.14 |

* cited by examiner

*Primary Examiner* — Fernando Hidalgo
(74) *Attorney, Agent, or Firm* — Eschweiler & Associates, LLC

(57) ABSTRACT

Some embodiments of the invention relate to a sense amplifier configured to determine the slope of a bitline charging voltage and to utilize the determined slope in combination with a voltage level sensing scheme to aid in reading data from a memory cell associated with the bitline. In particular, a sense amplifier circuit is configured to determine a slope of a bit line charging voltage and based upon the determined slope to adjust the slope of the bitline voltage (e.g., by adding a dynamic slope dependent current to a memory cell current configured to charge the bitline) provided to a sense amplifier. By adjusting the slope of the bitline voltage, the charging speed of memory cells in a low resistive state (e.g., having a high cell current and therefore a good SNR) can be increased.

21 Claims, 7 Drawing Sheets

SELF TIMED CURRENT INTEGRATING SCHEME EMPLOYING LEVEL AND SLOPE DETECTION

BACKGROUND

Modern day electronic memory (e.g., Flash memory) is comprised of millions of memory cells, each respectively configured to store one or more bits of data (e.g., as an electric charge). Retrieval of data from a memory cell can be accomplished by a read operation, wherein electric charge stored in a memory cell is provided to a bit line. To conserve power, the electric charge generates a small voltage on the bit line, which is subsequently amplified by a sense amplifier line into a "1" or a "0", by amplifying the small change in the bit line voltage into a full logic voltage swing (e.g., 2.5V)

Conventional voltage sense amplifiers typically compare the voltage on a bitline to a reference bias voltage and amplify this voltage difference to a full supply level (e.g., a VDD voltage). Sense amplifiers may be configured to operate various methods to sense the data stored in a memory cell including drain-side sensing and source-side sensing schemes. In a drain-side sensing scheme, the sensing circuitry is coupled to the bitline associated with the drain terminal of the cell to be sensed. In contrast, in a source-side sensing scheme the sensing circuitry is coupled to the bitline associated with the source terminal of the cell to be sensed.

DRAWINGS

FIG. 7b illustrates simulation result of the sense amplifier circuit shown in FIG. 7a.

DETAILED DESCRIPTION

Figure 1:
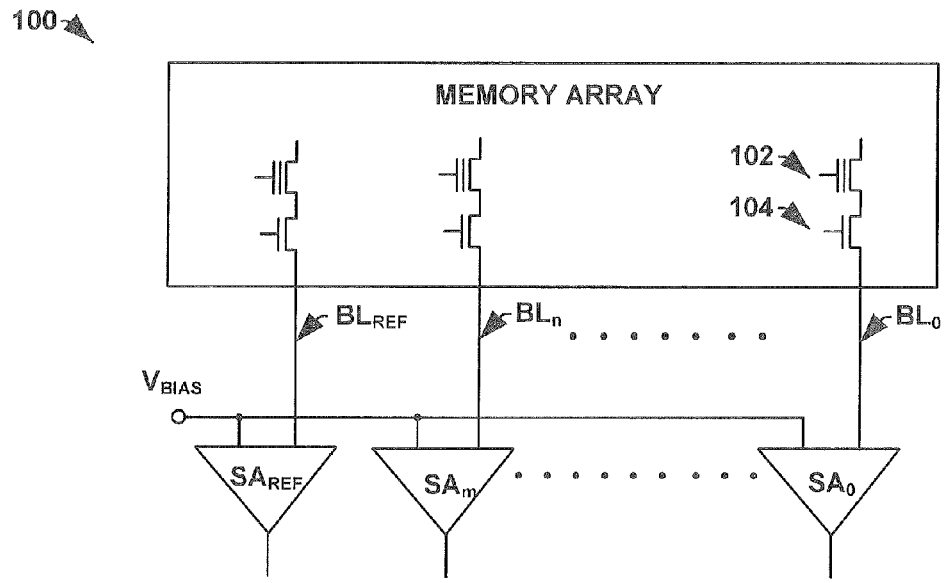
FIG. 1 illustrates an exemplary embodiment of a memory cell architecture.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details.

For high speed sensing (e.g., automotive applications) an array structure and cell biasing scheme attempt to provide maximum read-current with minimal bitline capacitance. This may be done through the use of a continuous pre-charging of the bitlines that provides peak current that can be used to pre-charging bitlines (e.g., from selected to deselected). For example, automotive applications provide high read throughput which by performing concurrent sensing operation on a plurality of sense amplifiers (e.g., on up to 280× 4=1160 sense amplifiers). In order to minimize the pre-charge time (e.g., the time it takes to raise a bitline from the 0V state into a regulated 1.2V) charges stored in a memory cell have to be provided to a bitline very quickly. This leads to high current and very high di/dt which can produce in conjunction with wiring and bond inductances to IR drop issues and ringing on the power supplies. Furthermore, utilizing a continuous pre-charge architecture may result in high bitline capacitance, which acts as a buffer capacitor to reduce high di/dt on power lines.

FIG. 1 illustrates an exemplary memory array 100 comprising memory cells having a floating gate transistor 102, configured to store charge associated with a data state, and a cell select transistor 104, connected to a bitline and configured to selectively couple the data state to the bitline. Such a memory cells can operate in two different states, depending on the amount and polarity of charge stored on the floating gate: a high threshold voltage ($V_T$) state and a low threshold voltage ($V_T$) state (i.e., the threshold voltage of a memory cell depends on the number of electrons stored on a floating gate and data is sensed depending on the amount of current provided by the cell). In the high $V_T$ state, electrons associated with a low data state are stored on floating gate leading to shift of $V_T$ that result in a high $V_T$/high resistive state and low current output to the bitline when the cell is read. In the low $V_T$ state, the storage of a high data state charges the floating gate positively resulting in a low $V_T$/low resistive state and high current being output from the floating gate when reading a cell. Typically, to enable a fast read speed, a flash memory should have a high cell current in the presence of a low bitline capacitance, thereby providing a good signal to noise ratio (SNR). Therefore, it is preferable to have a large cell current and a little distortion (e.g., a charging current of a capacitance).

Accordingly, a method and apparatus for improving memory reading is provided herein. The method and apparatus are configured to determine the slope of a bitline charging voltage and to utilize the determined slope in combination with a voltage level sensing scheme to aid in reading data from a memory cell associated with the bitline. In particular, a sense amplifier circuit is configured to determine a slope of a bit line charging voltage and based upon the determined slope to enhance (i.e., adjust) the slope of the bitline voltage provided to a sense amplifier. By adjusting the charging rate of the bitline voltage based upon the slope, the charging speed of memory cells in a low resistive state (e.g., having a high cell current and therefore a good SNR) can be increased.

In one embodiment, a memory circuit may comprise a plurality of sense amplifier circuits configured to perform slope detection in conjunction with a time based voltage level sensing scheme to improve the read window (i.e., read margin) of the memory circuit. In such an embodiment, the sense amplifier circuits are respectively coupled to bit lines of a memory array (e.g., via a multiplexor as described below in FIG. 3). During a read operation, a memory cell is configured to provide a current to a bitline which causes a voltage to accumulate on the bitline. A sense amplifier associated with the bitline is configured to determine the slope of the bitline voltage (e.g., the rate at which the bitline voltage is raised). If the slope of the bitline voltage is determined to be that of a high resistivity memory cell, based upon the determined slope, the sense amplifier will increase the bitline charging slope so that the sense amplifier reaches a threshold value sooner. Therefore, as provided herein, slope detection allows for an increased read margin of memory cells.

Figure 2A:
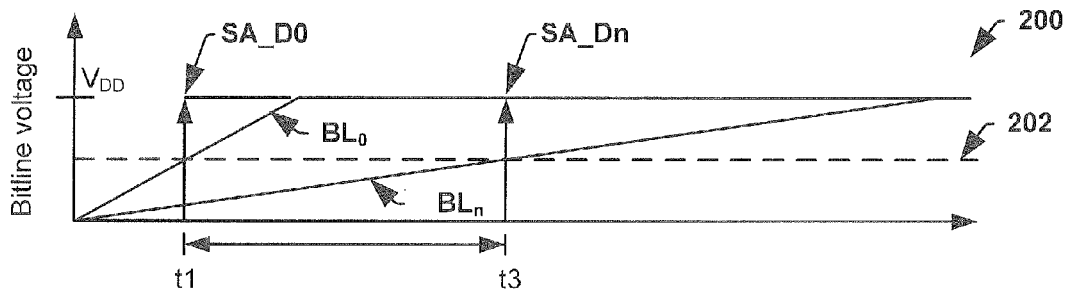
FIG. 2a is a signal diagram illustrating a bit line voltage charging as a function of time.

FIG. 2a illustrates a signal diagram 200 showing bit line charging voltages (x-axis) (i.e., the voltage of the bitline input into a sense amplifier) during the course of a read operation by a sense amplifier, as a function of time (y-axis). As shown in FIG. 2a, during a read operation, charge from a memory cell is provided to an associated bitline, causing the voltage of the bitline to increase over time. Typically, a sense amplifier may be configured to output a digital signal SA_D0 corresponding to a data state stored in the memory cell when a bitline voltage reaches a certain threshold voltage level 202.

As shown in FIG. 2a, different bitlines (e.g., bitline 0 ($BL_0$) and bitline n ($BL_n$)) charge at different speeds. For example, the voltage of $BL_0$ reaches the threshold voltage 202 in a time t1 that is shorter than the time it takes the voltage of bitline $BL_n$ to reaches the same threshold voltage 202. The charging speed of a bitline is based upon the amount and polarity of charge stored in an associated memory cell (e.g., the amount of charge stored on the floating gate of a flash memory cell). For example, memory cells having a high $V_T$/high resistive state will have a low current output that charges bitlines slower than cells having a low $V_T$/low resistive state. Therefore, if a memory cell to be read from a memory array is a low resistive cell, the associated bitline charges to the threshold voltage level 202 at a time that is earlier than the time a bitline associated with a high resistive cell will charge to the threshold voltage level 202. Therefore, as shown in FIG. 2a, the memory cell connected to $BL_0$ has a low resistive state while the memory cell connected to $BL_n$ has a high resistive state.

Figure 2B:
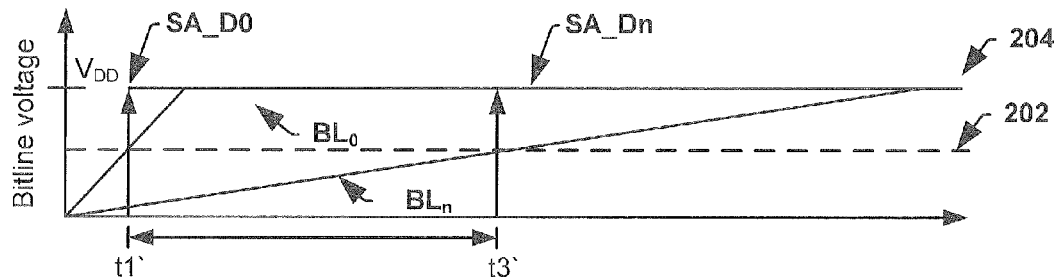
FIG. 2b is a signal diagram illustrating a bit line voltage charging as a function of time.

FIG. 2b illustrates a signal diagram 204 showing bit line charging voltages (x-axis) during the course of a read operation by a sense amplifier circuit having voltage sensing with slope detection as provided herein. As shown in FIG. 2b, slope detection enhances the slope of the bitline voltage (i.e., the charging rate of the bitline voltage) so that bitlines associated with low resistive memory cells (i.e., bitlines configured to quickly charge) reach the threshold voltage level 202 at a time t1', which is shorter than time t1. In other words, in the case of sensing a low resistive cell the charging speed of the bitline is high enabling a sense amplifier to generate its digital output signal earlier (t1') compared to common voltage sensing (t1).

Therefore, as shown in FIGS. 2a and 2b, voltage level sensing with voltage slope detection enhances the read margin between low resistive memory cells (having a good SNR ratio) and high resistive memory cells (having a poor SNR ratio) by taking the bitline charging speed into account.

Figure 3:
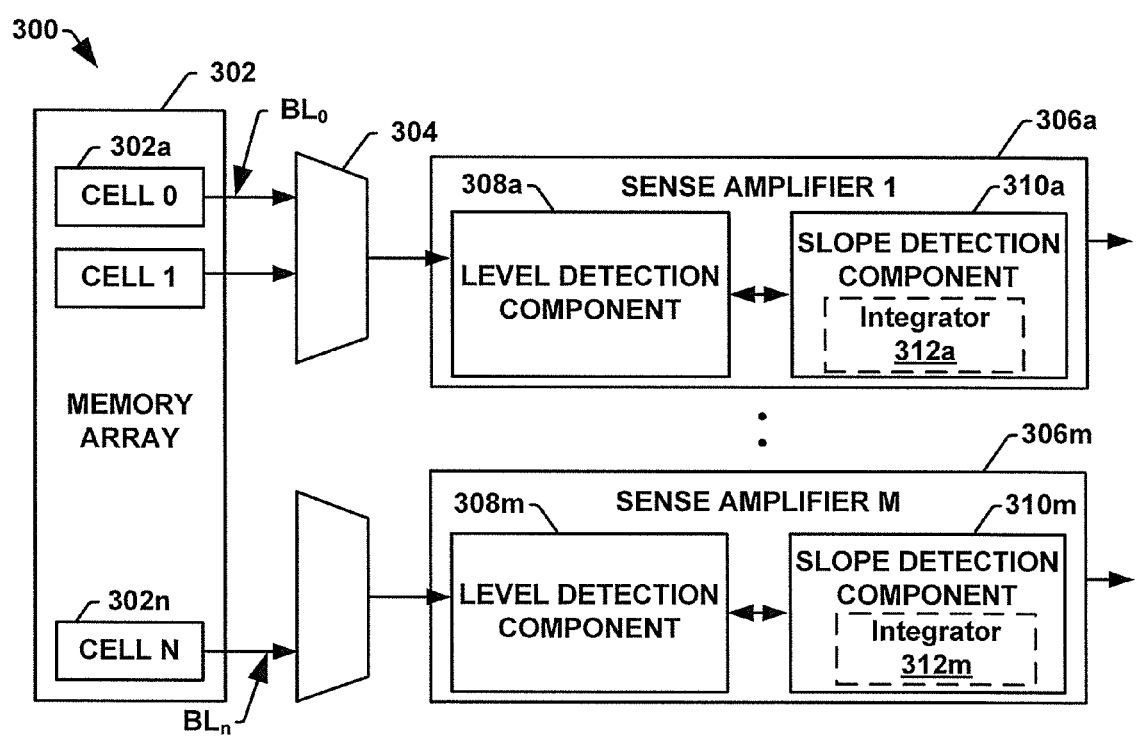
FIG. 3 illustrates a block diagram of a memory system comprising a plurality of sense amplifiers having a slope detection component.

FIG. 3 illustrates block diagram of a memory circuit 300 comprising one or more sense amplifiers configured to implement a voltage level sensing with slope detection of bitline voltages. As shown in FIG. 3, the circuit 300 comprises a memory array 302 having a plurality of memory cells 302a-302n. Each memory cell 302x (wherein x=a, . . . , n) is configured to generate a memory cell current that provides charge to an associated bitline (e.g., $BL_0$-$BL_n$), which couples the memory cell to a sense amplifier circuit (e.g., 306a-306m). One or more bitlines may be multiplexed by one or more multiplexors 304 to provide a signal associated with a read memory cell.

Respective sense amplifier circuits 306y (wherein y=a, . . . , m) comprise a level detection component 308y and a slope detection component 310y. The level detection component 308y may be configured to detect a voltage level of a bitline and to generate a sense amplifier output signal when the bitline voltage reaches a threshold voltage level (e.g., bias voltage).

The slope detection component 310y is configured to detect the slope of the bitline voltage as it charges the bitline. For example, in one embodiment the slope detection component may comprise an integrator 312y (wherein y=a, . . . , m) configured to integrate the current of the bitline over time. Due to the linear nature of the bitline charging voltage, the slope of the bitline voltage can be determined from the integration by determining when the integrated current reaches a predetermined value (e.g., dividing the predetermined voltage by the time it takes the voltage to reach the predetermined value).

The determined slope may then be used to selectively enhance the bitline charging when the slope is large (i.e., the voltage charging is fast), thereby triggering an output signal from an associated sense amplifier. In one embodiment, the slope of bitline voltages associated with a memory cell having a low resistive state are increased by a first factor, while the slope of bitline voltages associated with a memory cell having a higher resistive state are increased by a second factor smaller than the first factor. For example, if a bitline (e.g., $BL_0$) has a large bitline voltage slope, the slope detection component 310a of an associated sense amplifier 306a will provide feedback to the level detection component 308a that adjusts the charging rate of the bitline (i.e., the slope of the bitline voltage) in a manner that drives the output signal to a high data state in a shorter time. Alternatively, if a bitline has a small bitline voltage slope, the slope detection component of an associated sense amplifier will provide feedback to the level detection component that adjust the charging rate of the bitline (i.e., the slope of the bitline voltage) in a manner that drives the outputs signal to a high data state in a longer time.

In one embodiment, the slope detection component 310y may utilize the determined slope to accelerate or decelerate the charging rate of a bitline by adding a slope dependent dynamic current to the current output from an associated memory cell (e.g., memory cell current). The value of the slope dependent dynamic current may be directly proportionate to the detected slope so that a large slope results in a high slope dependent dynamic current being added to the memory cell current while a smaller slope results in a smaller slope dependent dynamic current being added to the memory cell current.

Figure 4A:
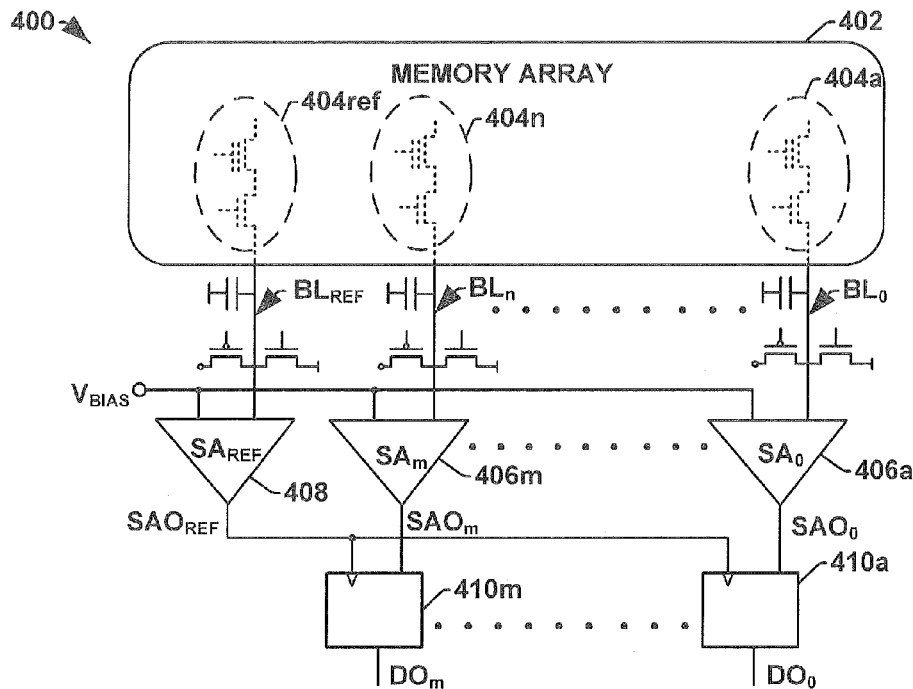
FIG. 4a illustrates block diagram of a memory system configured to perform a time domain sensing operation and slope detection.
Figure 4B:
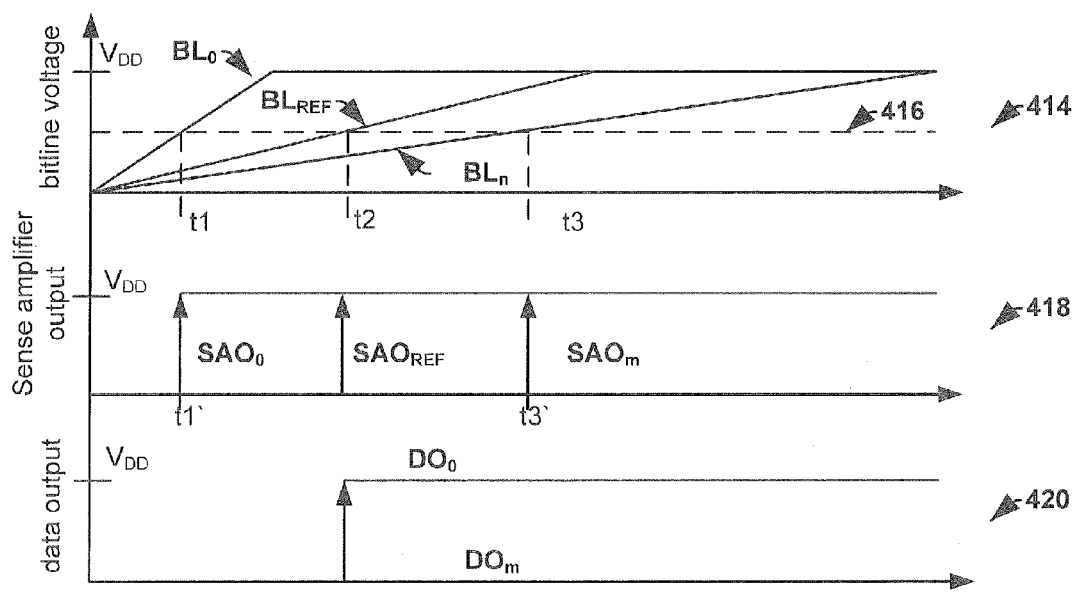
FIG. 4b illustrates signal diagrams of the memory system configured to perform a time domain sensing operation and slope detection.

In one embodiment, a sense amplifier may be configured to execute slope detection to enhance the operation of a time domain level sensing scheme. FIGS. 4a and 4b illustrate an embodiment of a memory system configured to operate a time domain level sensing, wherein a sense amplifying circuit is configured to convert a memory cell current to a bitline voltage that is analyzed in the time domain (i.e., a sensing scheme where bitlines reach a bias voltage at a time depending on their stored data state. FIG. 4a illustrates a block diagram of a memory circuit 400 as provided herein. FIG. 4b illustrates a corresponding timing diagram 412 of the memory circuit 400.

The memory circuit 400 comprises a memory array 402 having a plurality of memory cells 404a-404n that are accessible for read operations via bitlines $BL_0$-$BL_n$, respectively. As shown in FIG. 4a, the memory cells 404x (wherein x=a, . . . n) comprise a floating gate transistor, configured to store charge associated with a data state, and a cell select transistor. It will be appreciated that the memory cells shown in FIG. 4a are shown to illustrate a memory architecture having a cell select transistor coupled to a bitline and that one of ordinary skill in the art will appreciate that even though a single memory cell is shown coupled to a bitline a plurality of memory cells may be coupled to a single bitline. In one embodiment, the architecture may be read by a source side sensing scheme operating which offers a low bitline capacitance (CBL) and high cell current.

Referring to FIG. 4a, the memory circuit 400 comprises a plurality of bitline sense amplifiers 406a-406m (e.g., wherein m<n due to multiplexing of the bitlines as described in FIG. 3). Respective bitline sense amplifiers 406x are configured to have a first input coupled to a bit line of the memory array (e.g., $BL_0, \ldots, BL_n$) and a second input node coupled to a bias voltage $V_{BIAS}$. Respective sense amplifiers 406x are configured to generate an output signal $SAO_x$ indicative of the data state stored in an associated memory cell when the bitline voltage reaches the bias voltage $V_{BIAS}$. In this way the sense amplifiers act as a common level detector for voltage level sensing.

The output signals $SAO_x$ generated by respective bitline sense amplifiers 406a-406m are provided to a storage element 410x configured to take a clocked sampling of the sense amplifier output signal. In one embodiment the clocked storage element 410x may comprise a flip-flop/latch that is clocked by the reference output signal $SAO_{REF}$ of a reference sense amplifier 408 configured to transition the flip-flop from a transparent state into a storage state. The reference output signal $SAO_{REF}$ (e.g., digital reference output signal) is generated by the reference sense amplifier by reading the reference bitline, which is assigned to a reference memory cell configured to have a resistive state that is between a high resistive state and a low resistive state. In one embodiment, the memory cell may comprise a proper count of (e.g., substantially equal number of) high resistive memory cells and low resistive memory cells to provide a reference current to the bitline that is between a high cell current and a low cell current.

In particular, the reference sense amplifier 408 provides a signal that clocks the storage element 410x (e.g., flip-flop), causing the storage element 410x to provide a first (e.g., high) output signal $DO_x$ when the sense amplifier output signal is high (e.g., when the bitline charges to the target value) prior to the reference sense amplifier being high (e.g., when the reference bitline charges to the target value) and causing the flip flop 410x to provide a second (e.g., low) different output signal $DO_x$ when the sense amplifier output signal is high (e.g., when the bitline charges to the target value) after the reference sense amplifier is high.

Therefore, memory system 400 performs a voltage level sensing scheme that allows for differentiation between a high data state and a low data state by providing a reference point in time, before which a first data state (e.g., high) is output and after which a second (e.g., low) different data state is output (e.g., in FIG. 4b, $BL_0$ provides a high data state and $BL_n$ provides a low data state).

Operation of the memory circuit 400 is illustrated in FIG. 4b. As shown in signal diagram 414 the charging speed of respective bitlines are based upon the resistivity of an associated memory cell, which results in a low or high cell current. For example, as shown in FIG. 4b, the memory cell connected to bitline $BL_0$ has a low resistive state resulting in a high cell current configured to charge the bitline $BL_0$ to reach the bias voltage 416 at time t1. In contrast, the cell connected to bitline $BL_n$ is in a high resistive state resulting in a very low cell current configured to charge the bitline $BL_n$ to reach the bias voltage 416 at time t3. Furthermore, the reference bitline $BL_{REF}$, charged by a reference memory cell applying a reference current that is between the high cell current of $BL_0$ and the low cell current of $BL_n$, charges the reference bitline $BL_{REF}$ to reach the bias voltage 416 at time t2.

Signal diagram 418 illustrates the output of the sense amplifiers shown in circuit 400 (e.g., SA0, $SA_m$, $SA_{REF}$). Bitline sense amplifier 406a, reading the low resistive memory cell, generates a digital output signal $SAO_0$ at the time t1'. Sense amplifier 406m, reading the high resistive cell, generates a digital output $SAO_m$ at a time t3'. Due to slope detection the charging speed of bitline $BL_0$, associated with a low resistive cell, is high causing the sense amplifier to generate its digital output signal at a time t1', which is earlier than the time a sense amplifier not having slope detection (e.g., employing just voltage sensing) would generate a digital output signal. In this way the read margin of the proposed sense amplifier (e.g., the difference between t1' and t3') is higher compared to state-of-the art common voltage sensing.

To detect if a memory cell is a low or a high resistive cell, the output of a sense amplifier has to be evaluated at the timeframe between t1' and t3'. Therefore, the reference sense amplifier 408 is configured to provide a reference output signal $SAO_{REF}$ at time t2. The current of the reference cell has to be smaller than a low resistive state cell and higher than a high resistive cell state to ensure that t2 is between t1 and t3 (e.g., the current of the reference cell may be equal to one-half the current of the low resistive state cell) and therefore to allow the reference signal to distinguish between a low and high resistive state.

As shown in signal diagram 420, when the reference sense amplifier signal is low, the clocked storage element 410x will be in a transient state that does not store data. Therefore, the output of a clocked storage element configured to receive an output signal of a sense amplifier associated with a low resistive memory cell will be driven to a high value when the reference clock is driven high. Alternatively, after the output of the reference sense amplifier is high, the clocked storage element will output a low signal. Therefore, comparison of the reference sense amplifier value to the memory cell sense amplifier output allows for the bitline charging speed to be taken into account during a read operation.

Accordingly, as shown in FIG. 4b, as provided herein a slope detection method can be utilized in conjunction with a voltage level sensing scheme that converts a cell current to a bitline voltage and a bitline voltage to time domain. Since a reference sense amplifier provides a digital signal for reference time and not an analog signal like voltage or current (state-of-the-art) the proposed sensing scheme improves noise robustness of the system.

In one embodiment, as stated above, the memory circuit 400 comprises an architecture wherein a cell select transistor is connected to a bitline and configured to couple the bitline to a floating gate transistor, configured to store charge associated with a data state In such an architecture a sense amplifier may be configured to utilize source side sensing to optimize the combination of minimum bitline capacitance and maximum read current. Accordingly a sense amplifier configured to operate a source side sensing that improves read window and noise robustness of the system.

Figure 5:
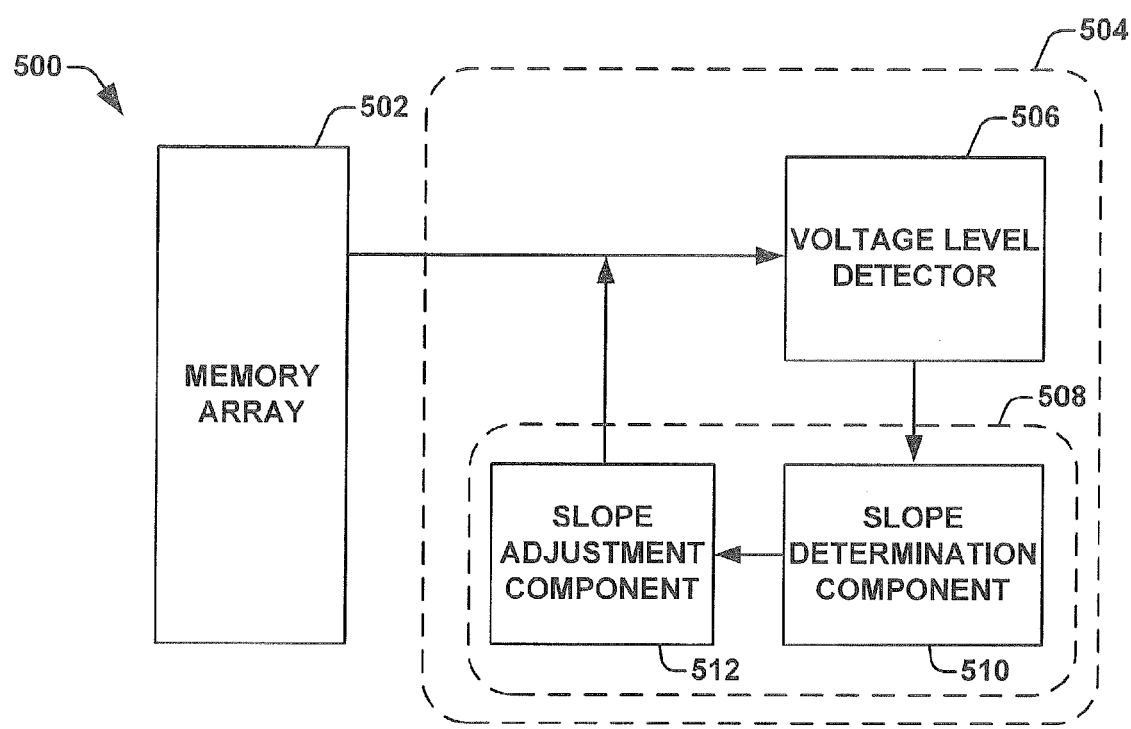
FIG. 5 illustrates a block diagram of a memory system comprising a sense amplifier configured to perform slope detection.

FIG. 5 illustrates a block diagram of a memory circuit 500 configured to implement a common voltage level sensing with slope detection to enhance read operation. As shown in FIG. 5, a sense amplifier 504 may be configured to comprise a voltage level detector 506 configured to receive the output of a bitline coupled to the memory array 502. The voltage level detector 506 is coupled to a slope detection component 508 that may comprise a slope determination component 510 and a slope adjustment component 512.

The slope determination component 510 is configured to determine the slope of the bitline voltage. In one embodiment the slope determination component 510 is configured to determine the slope of the bitline voltage by integration of the memory cell current provided to the bitline. For example, a capacitive element may be configured to integrate the memory cell current over a certain time until it reaches a predetermined value. The time that it takes the memory cell current to reach the predetermined value is indicative of the slope of the bitline charging voltage (e.g., a long charging time indicates a small slope, a short charging time indicates a large slope).

The slope adjustment component 512 is configured to utilize the determined slope to adjust the slope of the bitline voltage (e.g., the current provided to the bitline) in a feedback loop. For example, in one embodiment if a large slope is detected the source follower may shift the slope of the bitline voltage a large amount so that it reaches the threshold value of the voltage level detector at a sooner time (e.g., for low resistive memory cells) while if a smaller slope is detected the source follower may shift the slope of the bitline voltage a smaller amount.

Figure 6A:
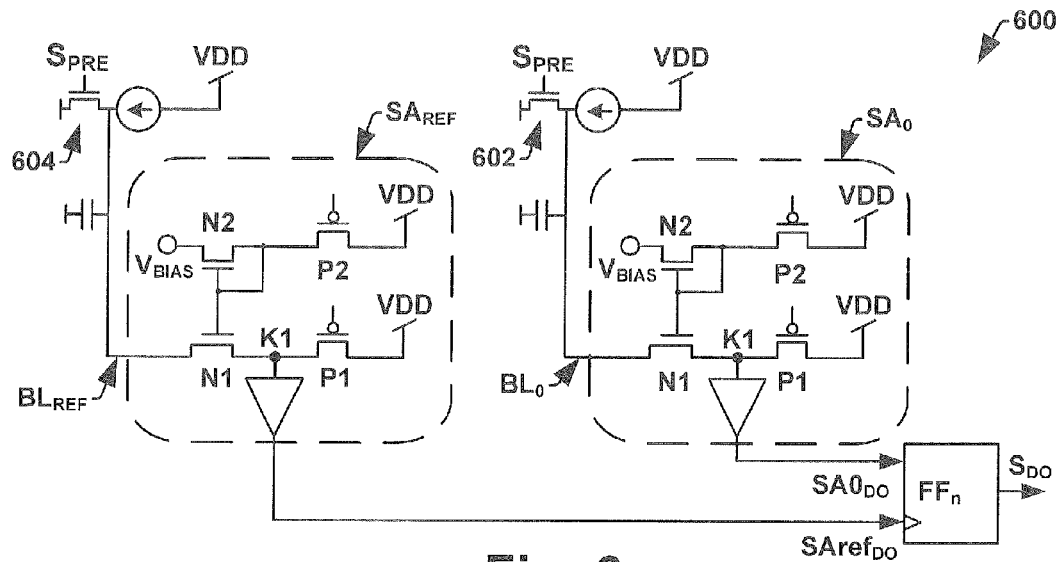
FIG. 6a illustrates a block diagram of a sense amplifier configured to perform a time domain level detection scheme.
Figure 6B:
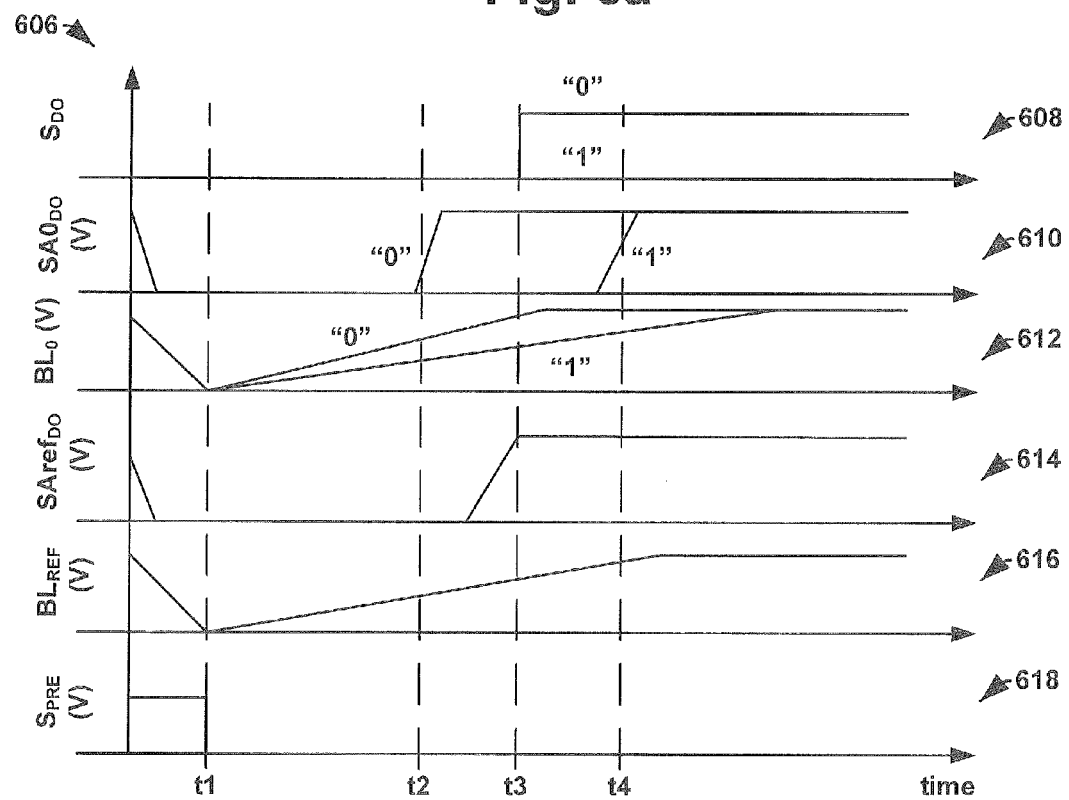
FIG. 6b illustrates signal diagrams of the sense amplifier configured to perform a time domain level detection scheme.

FIGS. 6a and 6b illustrate a more detailed embodiment of a sense amplifier circuitry configured to operate a time domain voltage level sensing scheme. FIG. 6a illustrates a block diagram of a source side sensing circuit 600 as provided herein. FIG. 6b illustrates a corresponding timing diagram 606 of sensing scheme.

Referring to FIG. 6a, a bitline sense amplifier $SA_0$ is coupled to a bitline $BL_0$ and a reference sense amplifier $SA_{REF}$ is coupled to a bitline $BL_{REF}$. The bitlines $BL_0$ and $BL_{REF}$ are respectively coupled to switching transistors 602 and 604, which are configured to discharge the bitlines to ground during a discharge of the memory array before starting integration of a voltage on bitlines. Respective sense amplifiers (e.g., $SA_0$, $SA_{REF}$) are configured to operate in a common gate configuration that compares a bias voltage $V_{BIAS}$ to a bitline voltage.

A memory cell provides a memory cell current to bitline $BL_0/BL_{REF}$, which raises the bitline voltage through integration of the memory cell current. The bitline $BL_0/BL_{REF}$ is further coupled to a current mirror comprising four transistors: N1, N2, P1, and P2. Transistor N1 is coupled to bitline $BL_0/BL_{REF}$. Transistor N2 is coupled to a bias voltage. As long as bitline voltage is lower than bias voltage, transistor N1 operates in an on-state because it has more gate source voltage than transistor N2. However, if the bitline voltage reaches the bias voltage, transistor N1 switches off causing the bias current provided via transistor P1 to raise node K1 to a voltage that results in a signal being output by the sense amplifier.

The sensing operation is illustrated in the signal diagrams of FIG. 6b. The sensing operates in two stages: a discharge stage and a sense stage. In the discharge stage (e.g., prior to t1) the previous read operations (signal diagrams 610-616) quickly settle to zero to prepare the memory for the next read. For example, a selected bitline of the memory array (e.g., BL1) has to be discharged from a pre-charged state (e.g., having a voltage of 1.2V) to ground (0V) in order to provide a VDS bias and a corresponding cell current.

At a first time t1, after discharge is completed, the memory cell current charges the bitline capacitance from VSS to a supply voltage VDD. Signal diagram 612 illustrates the bitline charging voltage of bitline BL0 for a low resistive memory cell "0" and for a high resistive memory cell "1". As previously explained, the bitline charging voltage of the low resistive memory cell "0" will reach the bias voltage at an earlier time t2 than the bitline charging voltage of a high resistive memory cell that reaches the bias voltage at a time t4.

To evaluate the output of the sense amplifier $SA_0$, the bitline charging voltage of the reference bitline will reach the bias voltage at time t3, which is greater than t2 and less than t4. The reference bitline voltage reaching the threshold voltage at t2 sets the flip-flop/latch $FF_n$ from a transparent state into a store state at the time t2, since the reference signal clocks the flip-flop. If the sense amplifier $SA_0$ is reading a high resistive cell the flip-flop FF generates output signal at time t4 it generates a data output ($S_{DO}$)) that remains 0, while if the sense amplifier $SA_0$ is reading a low resistive cell the flip-flop $FF_n$ generates an output signal at time t1, its data output ($S_{DO}$) will go high.

Figure 7A:
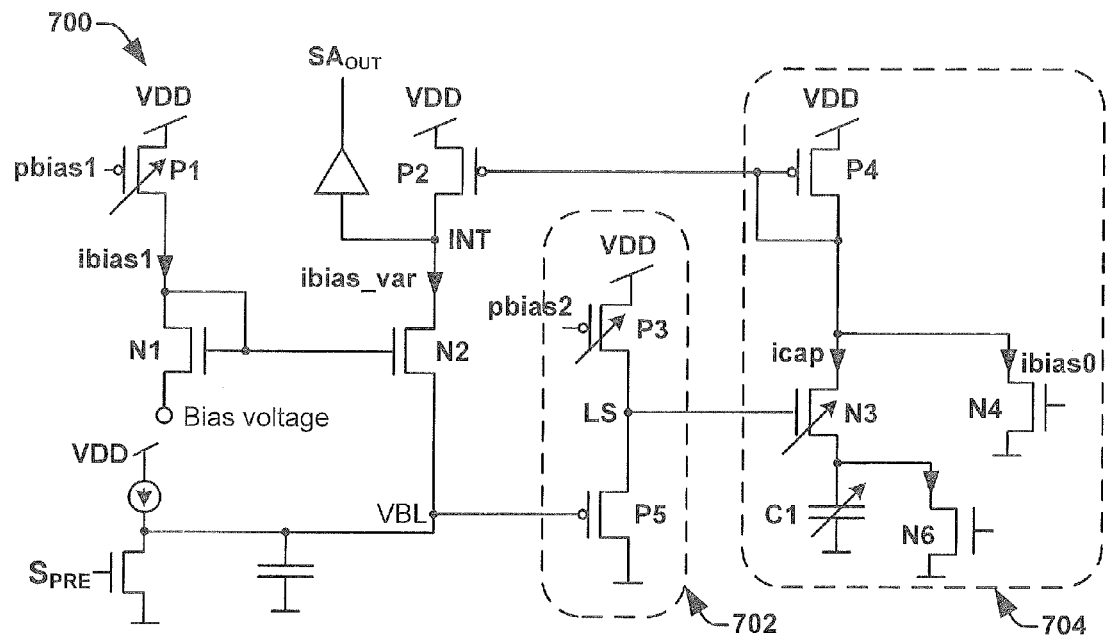
FIG. 7a illustrates a circuit diagram of a sense amplifier configured to perform a time domain level detection scheme and slope evaluation.
Figure 7B:
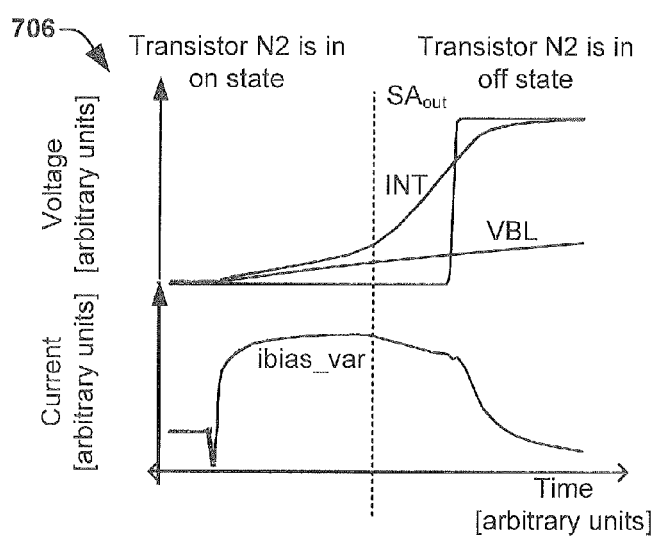

FIG. 7a illustrates a more detailed embodiment of a sense amplifier 700 configured to employ voltage level and slope detection. The sense amplifier 700 comprises distinct circuitry for level detection and for slope detection, which interacts to provide a voltage level sensing with slope detection. Simulation results illustrating operation of the sense amplifier 700 are shown in FIG. 7b.

For level detection, the sense amplifier 700 comprises a current mirror, having transistors N1 and N2, configured to act as voltage level detector. Before the bitline voltage reaches the bias voltage level, transistor N2 is turned on (e.g., is conducting), but when the bitline voltage reaches the bias voltage level transistor N2 is turned off (e.g., becomes non-conducting) and a signal is output by the sense amplifier.

For level and slope detection, the current supplied by P2 ibias_var has two components: icap and ibias0, wherein ibias0 is a constant offset current and icap is a dynamic bitline charging current dependent on the slope of the bitline. The value of ibias_var may be achieved by adding a source follower component 702 and a slope-controlled voltage source 704 to the sense amplifier 700, to generate slope dependent bitline charging current ibias_var for the INT node.

The source follower component 702, consisting of transistors P5 and P3, is configured to shift the bitline voltage to a voltage value of node LS=Vbitline+VGSp, wherein Vbitline is the bitline voltage and wherein VGSp is a dynamic gate-source voltage of transistor P5 which is a function of the slope of the bitline charging voltage.

The slope-controlled voltage source 704 comprises a PMOS diode P4 working together with transistor P2 as a current mirror and comprising a first and second branch. The first branch (comprising adjustable transistor N3 and adjustable capacitor C1) is configured to selectively generate a dynamic capacitive charging current icap that is provided to a grounded capacitor C1 when transistor N3 is turned on. During operation, transistor N3 is biased with a dynamic input voltage, which is dependent on the bitline slope and which varies the resistance of transistor N3. The higher the bitline slope, the lower the dynamic resistance and the higher is dynamic capacitive charging current icap. The second branch (comprising transistor N4) adds a constant current portion ibias0, which also helps to achieve proper biasing of P4.

For example, the shifted bitline voltage at node LS is applied to the gate of transistor N3, which turns on to provide charge to the capacitance C1. The quicker the bitline rises, the quicker the voltage at LS rises causing transistor N3 to drive more dynamic capacitive charging current icap to capacitor C1. For example, if the slope of the bitline charging voltage is high, the capacitor C1 will be charged fast thereby causing the dynamic capacitive charging current icap to be high. Alternatively, if the slope of the bitline charging voltage is low the capacitor C1 will be charged slowly thereby causing the dynamic capacitive charging current icap to be low.

The dynamic capacitive charging current icap plus the offset current ibias0 icap is measured by diode connected transistor P4. Since transistors P4 and P2 comprise a current mirror structure, the charging current from P2 to the bitline depends on the slope of the bitline charging voltage. In this way when transistor N2 is in off-state, the INT node is charged fast if the bitline voltage slope is high (e.g. sensing a low resistive cell state) and generating the signal $SA_{OUT}$ with sooner in time. In case the bitline voltage slope is low (e.g. sensing high resistive cell state) the INT node will be charged slowly resulting in high delay of the digital output signal $SA_{OUT}$.

It will be appreciated that in one embodiment, for bitlines associated with high resistive memory cells (i.e., bitlines configured to slowly charge) the offset current ibias0 may be reduced to reduce the slope of the bitline voltage (i.e., the amount of current provided to the bitline) and thereby drive the output of signal to a high data state at a later time. In such an embodiment, adjustment to the charging rate of high resistive memory cell may further improve the read margin of a sense amplifier.

Simulation results for the sense amplifier 700 are plotted in FIG. 7b. FIG. 7b illustrates the case of a memory cell in a low $V_T$ state, wherein slope detection accelerates the read operation. In particular, the node INT will first follow the bitline voltage (e.g., when N2 is in on-state) and as the bitline voltage reaches the bias voltage the INT node is charged fast to VDD (e.g., when N2 is in off-state). Therefore, as the INT voltage reaches threshold voltage of the sense amplifier the digital output signal $SA_{OUT}$ performs a fast transition from VSS to VDD based upon enhancement of the bitline current due to slope detection.

Figure 8:
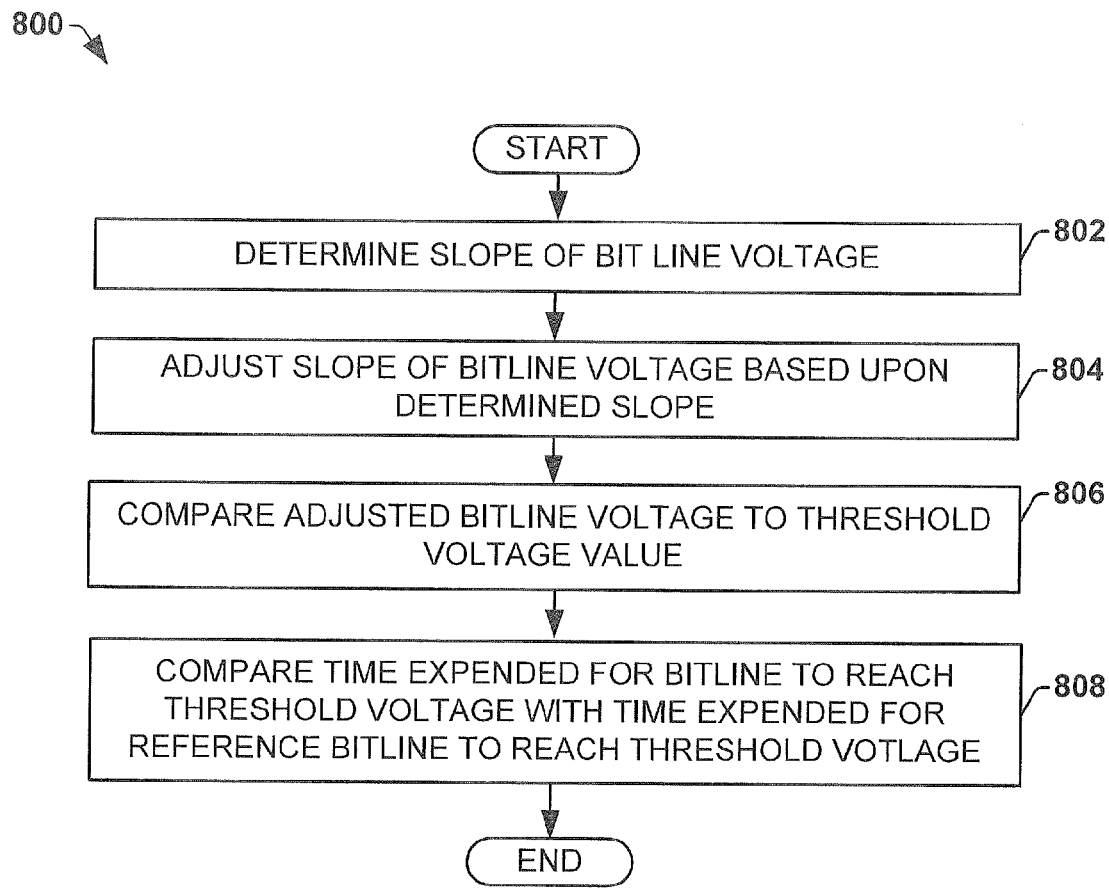
FIG. 8 illustrates a flow diagram of an exemplary method for reading data from a memory cell.

FIG. 8 illustrates a flow diagram of an exemplary method 800 for improving memory reading by determining the slope of a bitline charging voltage and utilizing the determined slope in combination with a voltage level sensing scheme.

While method 800 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

Furthermore, the claimed subject matter may be implemented as a method, apparatus, or article of manufacture using standard programming and/or engineering techniques to produce software, firmware, hardware, or any combination thereof to control a computer to implement the disclosed subject matter (e.g., the circuits shown in FIGS. 3, 5, 7a, etc., are non-limiting examples of circuits that may be used to implement method 800). The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

At 802 the slope of a bitline voltage is determined. The slope of the bitline voltage is based upon the current provided to the bitline (e.g., from a memory cell). In one embodiment the slope of the bitline charging voltage may be determined by integration of the memory cell current. For example, a capacitive element may be configured to integrate the memory cell current over a certain time until it reaches a predetermined value. The time that it takes the memory cell current to reach the predetermined value is indicative of the slope of the bitline charging voltage (e.g., a long charging time indicates a small slope, a short charging time indicates a large slope).

The slope of the bitline voltage is adjusted based upon the determined slope at 804. In one embodiment the slope of the bitline voltage (e.g., the charging rate of the bitline voltage) may be adjusted by adding a slope dependent dynamic current to the memory cell current. In one embodiment if a large slope is detected (e.g., for low resistive, high current memory cells) the voltage of the bitline may be shifted so that it reaches the threshold value of the voltage level detector at a sooner time.

At 806 the adjusted bitline voltage is compared to threshold voltage value. Comparison of the bitline voltage to a threshold voltage value may be part of a level sensing scheme, wherein a sense amplifier signal is generated when the bitline voltage reaches the threshold voltage value.

At 808 the time expended for the adjusted bitline to reach the threshold voltage is compared with the time expended for a reference bitline to reach the threshold value. In one embodiment, the level sensing scheme may comprise a time domain level sensing, wherein the reference signal distinguishes between a low and high resistive state based upon the time at which the bitline voltage reaches a predetermined threshold (e.g., bias voltage). For example, if the bitline voltage reaches a predetermined threshold value (e.g., bias voltage) at a time sooner than the reference signal reaches the same predetermined threshold value, then the bitline voltage is associated with a low VT cell (e.g., storing a high data state).

Although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. In addition, the articles "a" and "an" as used in this application and the appended claims are to be construed to mean "one or more".

Furthermore, to the extent that the terms "includes", "having", "has", "with", or variants thereof are used in either the detailed description or the claims, such terms are intended to be inclusive in a manner similar to the term "comprising."

What is claimed is:

1. A memory circuit, comprising:
   a memory cell configured to generate a memory cell current that provides charge to an associated bitline, wherein the charge increases on the bitline as a function of time to generate a bitline voltage having a slope;

a slope detection component coupled to the bitline and configured to detect the slope of the bitline voltage associated with a read operation of the memory cell within a resistive state, and to enhance the slope of the bitline voltage during the read operation based upon the resistive state of the memory cell; and a level detection component configured to detect a voltage level of the bitline and to generate a sense amplifier output signal when the bitline voltage is greater than a threshold voltage level.

2. The memory circuit of claim 1, wherein enhancing the slope of the bitline voltage comprises increasing the slope of the bitline voltage by a first factor for bitlines associated with low resistive state memory cell, and wherein enhancing the slope of the bitline voltage comprises increasing the slope of the bitline voltage by a second factor for bitlines associated with higher resistive state memory, wherein the first factor is larger than the second factor.

3. The memory circuit of claim 1, wherein the slope detection component comprises an integrator configured to integrate the memory cell current of the bitline over time and to determine the slope from the integrated current.

4. The memory circuit of claim 1, comprising:
a reference sense amplifier configured to generate an reference output signal, the reference sense amplifier having a first input coupled to a threshold voltage signal and a second input coupled to a reference bitline associated with a medium resistive memory cell that provides a current that is lower than a current provided by a memory cell storing a high data state and higher than a current provided by a memory cell storing a low data state;
wherein if the reference output signal is a low at a time preceding the bitline reaching a target level an evaluation circuit will generate a high data state, and wherein if the reference output signal is a high at the time after a bitline reaching the target level the evaluation circuit will generate a low data state.

5. The memory circuit of claim 4, wherein the medium resistive memory cell comprises a proper count of high resistive memory cells and low resistive memory cells to provide a medium memory cell current that is substantially equal to one half a current of the low memory cell.

6. The memory circuit of claim 4, wherein the evaluation circuit comprises a storage element configured to take a clocked sampling of the sense amplifier output signal.

7. The memory circuit of claim 6, wherein the storage element configured to take a clocked sampling comprises a latch clocked by the reference output signal and configured to receive the sense amplifier output signal.

8. The memory circuit of claim 1, wherein the level detection component comprises a current mirror having a first transistor coupled to the bitline and a second transistor coupled to a bias voltage held at the threshold voltage level, and
wherein when the bitline voltage reaches the threshold voltage level the first transistor switches off, causing a sense amplifier to output the sense amplifier output signal.

9. The memory circuit of claim 1, wherein the slope detection component comprises:
a slope controlled voltage source comprising a first transistor configured to provide a dynamic bitline charging current and a PMOS diode operating with the first transistor as a current mirror,
wherein the PMOS diode is coupled to a second adjustable transistor having a resistance that is proportional to the slope of the bitline, the second adjustable transistor configured to selectively generate a dynamic capacitive charging current that is provided to an adjustable capacitor when the adjustable transistor is turned on,
wherein the dynamic bitline charging current provided by the first transistor is dependent upon the dynamic capacitive charging current.

10. The memory circuit of claim 9, the slope detection component comprises a source follower component comprising a third transistor having a drain coupled to a source of a fourth transistor at a first node coupled to a gate of the second adjustable transistor.

11. A sense amplifier circuit comprising, comprising:
a slope detection component configured to determine the slope of a bitline voltage during a read operation of a memory cell within a resistive state and to selectively increase the slope of the bitline voltage if the determined slope corresponds to a high resistive state of a memory cell being read to increase a charging speed of bitline; and
a level detection component configured generate a sense amplifier output signal when the bitline voltage is greater than a threshold voltage level;
wherein enhancing the slope of the bitline decreases a time expended for the bitline to reach the threshold voltage level.

12. The circuit of claim 11, wherein enhancing the slope of the bitline voltage comprises increasing the slope of the bitline voltage by a first factor for bitlines associated with low resistive state memory cell, and wherein enhancing the slope of the bitline voltage comprises increasing the slope of the bitline voltage by a second factor for bitlines associated with higher resistive state memory, wherein the first factor is larger than the second factor.

13. The circuit of claim 11, comprising:
a reference sense amplifier configured to generate an reference output signal, the reference sense amplifier having a first input coupled to a threshold voltage signal and a second input coupled to a reference bitline associated with a medium resistive memory cell that provides a current that is lower than a current provided by a memory cell storing a high data state and higher than a current provided by a memory cell storing a low data state;
wherein if the reference output signal is a low at a time preceding the bitline reaching a target level an evaluation circuit will generate a first data state, and wherein if the reference output signal is a high at the time after a bitline reaching the target level the evaluation circuit will generate a second, different data state.

14. The circuit of claim 13, wherein the medium resistive memory cell comprises a proper count of high resistive memory cells and low resistive memory cells that provide a medium memory cell current that is substantially equal to one half a current of the low memory cell.

15. The circuit of claim 13, wherein the evaluation circuit comprises a storage element configured to take a clocked sampling of the sense amplifier output signal.

16. The circuit of claim 11, wherein the level detection component comprises a current mirror having a first transistor coupled to the bitline and a second transistor coupled to a bias voltage held at the threshold voltage level, and
wherein when the bitline voltage reaches the threshold voltage level the first transistor switches off, causing a sense amplifier to output the sense amplifier output signal.

17. The circuit of claim 11, wherein the slope detection component further comprises a slope controlled voltage source comprising a first transistor configured to provide a dynamic bitline charging current and a PMOS diode operating with the first transistor as a current mirror, wherein the PMOS diode is coupled to a second adjustable transistor having a resistance that is proportional to the slope of the bitline, the second adjustable transistor configured to selectively generate a dynamic capacitive charging current that is provided to an adjustable capacitor when the adjustable transistor is turned on, wherein the dynamic bitline charging current provided by the first transistor is dependent upon the dynamic capacitive charging current.

18. A method for reading a memory cell, comprising:
determining the slope of a bitline voltage provided by the memory cell within a resistive state;
selectively enhancing the slope of the bitline voltage during a read operation of the memory cell based upon the determined slope; and
comparing the enhanced bitline voltage to a threshold voltage value and providing a sense amplifier output signal based upon a time that the enhanced bitline voltage reaches the threshold voltage value.

19. The method of claim 18, wherein enhancing the slope of the bitline voltage comprises increasing the slope of the bitline voltage by a first factor for bitlines associated with low resistive state memory cell, and wherein enhancing the slope of the bitline voltage comprises increasing the slope of the bitline voltage by a second factor for bitlines associated with higher resistive state memory, wherein the first factor is larger than the second factor.

20. The method of claim 18, further comprising:
comparing the time that the enhanced bitline voltage reaches the threshold voltage value with the time that a reference signal takes to reach the threshold value, wherein if the time that the enhanced bitline voltage takes to reach the threshold voltage value is shorter than the time that the reference signal takes to reach the threshold value a first data state is output, and wherein if the time that the enhanced bitline voltage takes to reach the threshold voltage value is longer than the time that a reference signal takes to reach the threshold value a second, different data state is output.

21. The memory circuit of claim 1, comprising:
a reference sense amplifier configured to generate an reference output signal associated with a medium resistive memory cell that provides a current that is lower than a current provided by a memory cell storing a high data state and higher than a current provided by a memory cell storing a low data state, wherein the reference output signal is used to differentiate between a high data state and a low data state by providing a reference point in time.

* * * * *